(12) United States Patent
Jeong et al.

(10) Patent No.: US 12,328,424 B2
(45) Date of Patent: Jun. 10, 2025

(54) INTERFACE BOARD FOR TESTING IMAGE SENSOR, TEST SYSTEM HAVING THE SAME, AND OPERATING METHOD THEREOF

(71) Applicant: Samsung Electronics Co., Ltd., Suwon-si (KR)

(72) Inventors: Shinki Jeong, Hwaseong-si (KR); Hyungsun Ryu, Suwon-si (KR); Seongkwan Lee, Yongin-si (KR); Jaemoo Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 546 days.

(21) Appl. No.: 17/691,290

(22) Filed: Mar. 10, 2022

(65) Prior Publication Data

US 2023/0047664 A1 Feb. 16, 2023

(30) Foreign Application Priority Data

Aug. 11, 2021 (KR) ........................ 10-2021-0105956

(51) Int. Cl.
*H04N 25/76* (2023.01)
*G01R 1/073* (2006.01)
(Continued)

(52) U.S. Cl.
CPC ....... *H04N 17/002* (2013.01); *G01R 1/07307* (2013.01); *G01R 31/2889* (2013.01); *H04N 25/76* (2023.01); *H01R 13/24* (2013.01)

(58) Field of Classification Search
CPC ... G01R 31/2889; H04N 17/002; H01R 13/24
See application file for complete search history.

(56) References Cited

U.S. PATENT DOCUMENTS 4,792,932 A * 12/1988 Bowhers ............ G01R 31/2834
324/76.44
6,625,557 B1 * 9/2003 Perkins .............. G01R 31/3167
714/724
(Continued)

FOREIGN PATENT DOCUMENTS

JP 2011-094991 A 5/2011
KR 20040025189 A 3/2004
(Continued)

OTHER PUBLICATIONS

Korean Office Action for corresponding application No. KR 10-2021-0105956, issued Jan. 31, 2025.

*Primary Examiner* — Daniel R Miller
*Assistant Examiner* — George O Sahyoun
(74) *Attorney, Agent, or Firm* — FINNEGAN, HENDERSON, FARABOW, GARRETT & DUNNER LLP

(57) ABSTRACT

A testing system for testing an image sensor, includes a probe card, a pogo block receiving output signals of the probe card, an interface board configured to receive output signals of the pogo block, convert the received output signals of the pogo block, and output the converted signals through a cable, and a testing apparatus connected to the interface board through the cable. The testing apparatus is configured to test the device under test through signals received through the cable. The interface board includes an active interface module configured to amplify the received output signals of the pogo block, convert the amplified signals into signals having a same frequency as the received output signals of the pogo block, and transmit the converted signals to the cable.

18 Claims, 11 Drawing Sheets

(51) Int. Cl.
    *G01R 31/28*     (2006.01)
    *H01R 13/24*     (2006.01)
    *H04N 17/00*     (2006.01)

(56)         References Cited

U.S. PATENT DOCUMENTS

| | | |
|---|---|---|
| 6,904,375 B1 | 6/2005 | Sabih et al. |
| 7,453,932 B2 | 11/2008 | Awaji et al. |
| 8,239,147 B2 | 8/2012 | Watanabe et al. |
| 9,075,097 B2 | 7/2015 | Kobayashi |
| 9,562,928 B2 | 2/2017 | Cheng et al. |
| 2002/0094850 A1* | 7/2002 | Brigaud ............... H03G 3/3047 455/574 |
| 2005/0159021 A1* | 7/2005 | Swantner ............. H01R 12/727 439/63 |
| 2007/0271059 A1 | 11/2007 | Vonstaudt |
| 2009/0135414 A1 | 5/2009 | Chang et al. |
| 2014/0145745 A1* | 5/2014 | Ryu ................... G01R 31/2889 324/762.01 |
| 2018/0004257 A1* | 1/2018 | Hung ...................... G06F 1/185 |
| 2021/0132146 A1 | 5/2021 | Tsai et al. |

FOREIGN PATENT DOCUMENTS

| | | |
|---|---|---|
| KR | 20060045879 A | 5/2006 |
| KR | 20100092949 A | 8/2010 |
| KR | 10-1050111 B1 | 7/2011 |
| KR | 20210054964 A | 5/2021 |

\* cited by examiner

INTERFACE BOARD FOR TESTING IMAGE SENSOR, TEST SYSTEM HAVING THE SAME, AND OPERATING METHOD THEREOF

CROSS-REFERENCE TO RELATED APPLICATION

This application claims benefit of priority to Korean Patent Application No. 10-2021-0105956 filed on Aug. 11, 2021 in the Korean Intellectual Property Office, the disclosure of which is incorporated herein by reference in its entirety.

BACKGROUND

1. Field

The present inventive concepts relate to interface boards for testing an image sensor, testing systems having the same, and operating methods thereof.

2. Description of Related Art

In general, an image sensor is a semiconductor device converting an optical image into an electrical signal. A CMOS image sensor uses a very simple CMOS process compared to a charge coupled device (CCD) image sensor process, so manufacturing costs can be reduced, and peripheral circuits such as signal processing circuits can be formed in a single chip, which are advantages. Due to these characteristics, the CMOS image sensor is in a spotlight as a next-generation image sensor. A final output signal of the CMOS image sensor is generated by an image processing unit. Therefore, in order to test operating characteristics of the CMOS image sensor, an output of the image processing unit generating a final output signal should be used. However, since tens to millions of unit pixels are provided in the CMOS image sensor, it takes a lot of testing time to test all data detected from the pixels.

SUMMARY

An aspect of the present inventive concepts is to provide an apparatus for testing an image sensor suitable for a high-speed signal and an operating method thereof.

According to some example embodiments of the present inventive concepts, a testing system for testing an image sensor may include: a probe card contacting pads of a device under test; a pogo block configured to receive output signals of the probe card; an interface board configured to receive output signals of the pogo block, convert the received output signals of the pogo block, and output the converted signals through a cable; and a testing apparatus connected to the interface board through the cable, and configured to test the device under test through signals received through the cable. The interface board may include an active interface module configured to amplify the received output signals of the pogo block, convert the amplified signals into the converted signals such that the converted signals have a same frequency as the received output signals of the pogo block, and transmit the converted signals to the cable.

According to some example embodiments of the present inventive concepts, an interface board for testing an image sensor may include: a DC switch circuit configured to switch received signals to a testing apparatus for DC testing; a signal compensation circuit configured to amplify the received signals; a signal generation circuit configured to convert the amplified signals into differential signals having a same frequency as the received signals; a standard mode circuit having a circuit corresponding a communication standard of the image sensor; and a reference voltage generation circuit configured to generate a reference voltage in response to a voltage control signal received from the testing apparatus.

According to some example embodiments of the present inventive concepts, an operating method for testing an image sensor may include: an operation of receiving image signals from a device under test; an operation of amplifying the received image signals; an operation of converting the amplified signals into differential signals; and an operation of transmitting the converted signals to a testing apparatus via a cable.

BRIEF DESCRIPTION OF THE DRAWINGS

The above and other aspects, features and other advantages of the present inventive concepts will be more clearly understood from the following detailed description, taken in conjunction with the accompanying drawings, in which.

DETAILED DESCRIPTION

Hereinafter, example embodiments of the present inventive concepts will be described clearly and in detail with reference to the accompanying drawings by those skilled in the art.

It will be understood that, as described herein, a "level" of a signal, voltage, or the like may be interchangeably referred to as a magnitude of the signal, voltage, or the like.

As described herein, when an operation is described to be performed "by" performing additional operations, it will be understood that the operation may be performed "based on"

the additional operations, which may include performing said additional operations alone or in combination with other further additional operations.

An apparatus for testing an image sensor and an operation method thereof according to some example embodiments of the present inventive concepts may implement an optimal test operation according to various transmission methods by including an interface module corresponding to a standard of high-speed signals.

Figure 1:
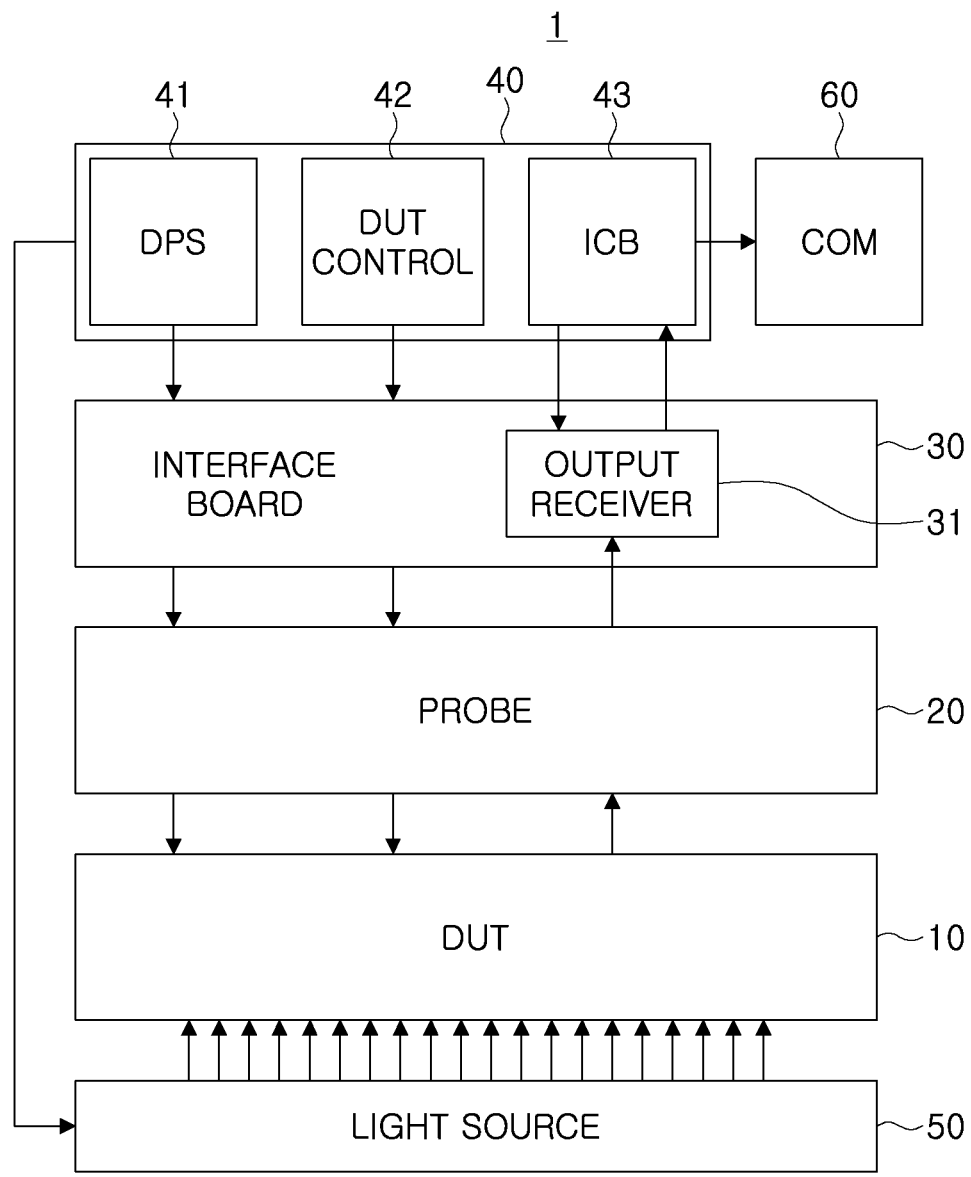
FIG. 1 is a diagram illustrating a general testing system according to some example embodiments of the present inventive concepts.

FIG. 1 is a diagram illustrating a general testing system 1 according to some example embodiments of the present inventive concepts. Referring to FIG. 1, the testing system 1 includes a device under test (DUT) 10 as a test target, a probe card 20 directly electrically connecting the DUT 10 using a probe, and an interface board 30 for mapping the probe card 20 and an automatic testing apparatus (ATM) 40. It will be understood that, in some example embodiments, the DUT 10 may be separate from the testing system 1.

The DUT 10 is a device requiring verification before product release. The DUT 10 according to some example embodiments of the present inventive concepts may be an image sensor. The DUT 10 may be at least one image sensor on a wafer or a CMOS image sensor manufactured in a form of a package.

In general, the image sensor is largely divided into an image sensing unit (also referred to herein as an image sensing device) and an image signal processing unit (also referred to herein as an image processing device). The image sensing unit performs a function of encoding an amount of input light. The image processing unit performs an image processing function of reconstructing an image signal by interpolating the signal coded by the image sensing unit. In some example embodiments, the image sensing unit and the image processing unit may each be configured as separate chips. In some example embodiments, the image sensing unit and the image processing unit may be configured in a single chip form using a system on chip (SoC) technology. A plurality of pixels arranged in matrix form are included in a region in which a plurality of rows and a plurality of columns intersect in the image sensing unit. Each pixel converts an electrical charge induced by the input light into a voltage value. An analog voltage generated by each pixel is converted into digital form through Correlated Double Sampling (CDS). The converted digital data is input to an image processing unit and reconstructed as an image signal.

A final output signal of the image sensor is generated by the image processing unit. Therefore, in order to test operating characteristics of the image sensor, an output of the image processing unit generating the final output signal should be used. In general, tens to millions of unit pixels are provided in an image sensor. For this reason, it takes a lot of test time to test all the data detected from the pixels.

The probe card 20 has as many input and output pads/pins of the DUT 10 as probes for directly electrically connecting the DUT 10. In general, if the number of input and output pads of the DUT 10 is 10, and the number of probes of the probe card 20 is 100, the testing apparatus 40 may test 10 DUTs 10 simultaneously. However, in general, the number (e.g., quantity) of probes of the probe card 20 is limited by the number of channels provided by the testing apparatus 40. An input probe of the probe card 20 is connected to the DUT 10, and an output probe of the probe card 20 is connected to the interface board 30. Accordingly, the probe card 20 may provide more probes than the number of channels provided by the testing apparatus 40.

The interface board 30 is implemented (e.g., is configured) to map the probe card 20 and the testing apparatus 40. Also, the interface board 30 includes an output receiver 31 (e.g., an output transceiver) for receiving an output signal of the DUT 10. The output receiver 31 receives an image signal of the DUT 10 transmitted from the output probe of the probe card 20 (e.g., output signals of the probe card 20).

The testing apparatus 40 includes a power supply device (DPS) 41, a device under test controller 42, and an image capture board (ICB) 43. The power supply device DPS 41 is implemented to supply power to the interface board 30. The device under test controller 42 is set to output an image from the DUT 10. The image capture board (ICB) 43 may be implemented to analyze an image signal received from the interface board 30. The analyzed signals are transmitted to a computer (COM) 60. The computer 60 image processes the transmitted signal.

Also, the testing apparatus 40 includes a light source 50 that delivers an input (i.e., light) to the DUT 10. The light source 50 may input various illuminances to the DUT 10. That is, the testing apparatus 40 controls the light source 50 to output light having various degrees of brightness (i.e., illuminance) to the DUT 10. The DUT 10 transmits an output signal (i.e., an image signal) corresponding to the input illuminance to the output receiver 31 through an output probe of the probe card 20. Accordingly, the testing apparatus may be configured to test the DUT 10 based on signals received through the cable via which the testing apparatus 40 is connected to the interface board 30.

Figure 2:
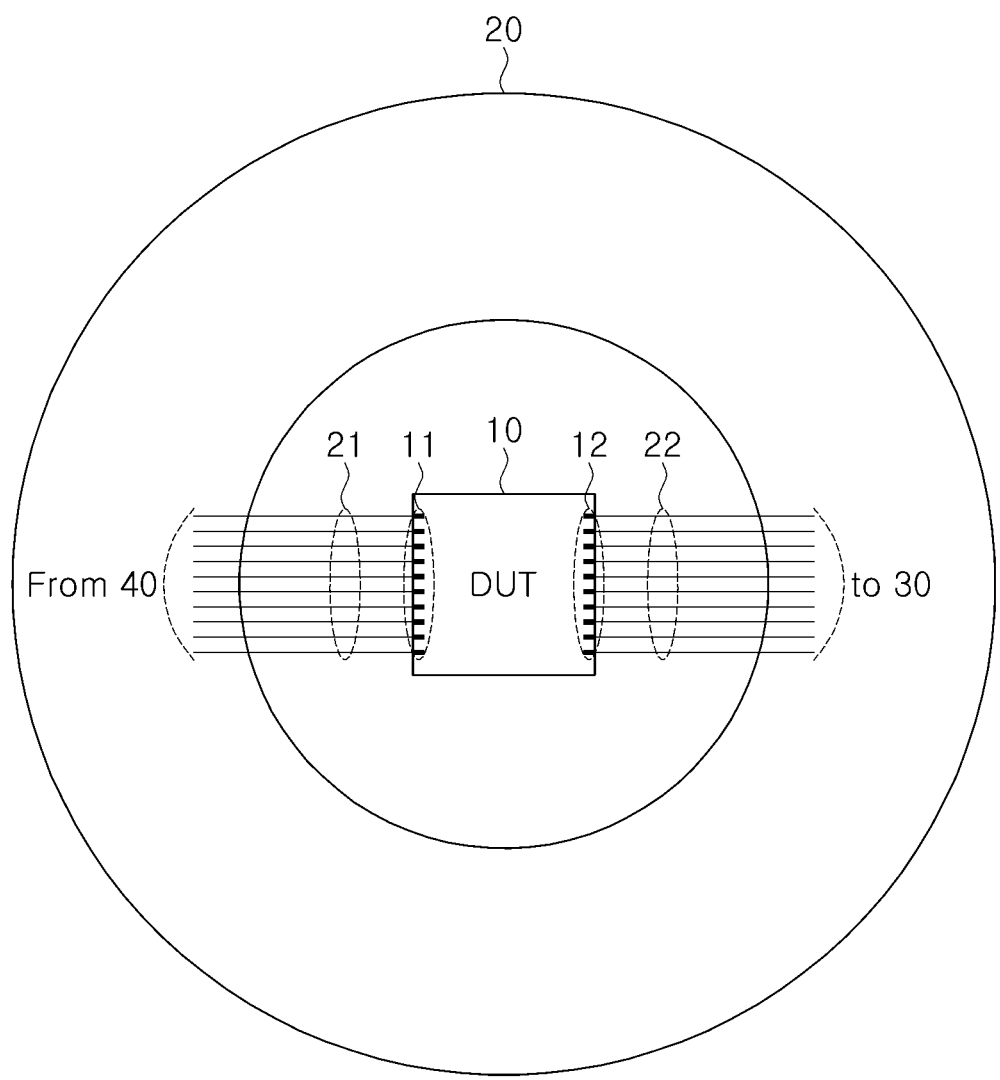
FIG. 2 is a view illustrating a DUT and a probe card illustrated in FIG. 1 according to some example embodiments of the present inventive concepts.

FIG. 2 is a view illustrating the DUT 10 and the probe card 20 shown in FIG. 1 according to some example embodiments of the present inventive concepts. Referring to FIG. 2, the probe card 20 is illustrated as being electrically connected to one DUT 10. Meanwhile, the probe card 20 may be connected to more DUTs 10.

The DUT 10 includes a plurality of input pads 11 and a plurality of output pads 12. Each of the plurality of input pads 11 is electrically connected to each of the plurality of input probes 21 of the probe card 20. In addition, each of the plurality of output pads 12 is electrically connected to each of the plurality of output probes 22 of the probe card 20. Each of the plurality of input probes 21 of the probe card 20 is connected to the testing apparatus 40 through the interface board 30. Each of the plurality of output probes 22 of the probe card 20 is connected to the interface board 30. The DUT 10 receives input and control signals from the testing apparatus 40 through each of the plurality of input probes 21 of the probe card 20. Also, the DUT 10 transmits an image signal to the interface board 30 through each of the plurality of output probes 22 of the probe card 20. The testing apparatus 40 may simultaneously test at least two DUTs 10. In general, the number of DUTs 10 that the testing apparatus 40 can test simultaneously depends on the number of channels in the testing apparatus.

In a general testing system, in testing a wafer (or, a device under test (DUT)), a testing system is transmitted from a probe card to a POGO pin, from a POGO pin to an interface board, and from an interface board to a cable. In a high-speed signal, since signal degradation occurs due to a signal transmission length and a contact structure, such a test signal may not be received at a signal receiving unit of the testing apparatus (ATM). High-speed signal testing may not be performed in general testing systems. In addition, a large amount of costs and a long development period may be required for the generation extension of the equipment of the testing system.

The testing system according to some example embodiments of the present inventive concepts can perform a high-speed signal (e.g., 3 Gbps or higher signal) test by adding a signal amplification circuit and a signal conversion circuit between signal transmission paths. The testing system according to some example embodiments of the present inventive concepts has less signal loss than the conventional one by positioning the signal amplification circuit and the signal conversion circuit closest to the wafer (or DUT). In addition, the testing system of the present inventive concepts can compensate for signal loss due to the probe card and POGO pin. In addition, by converting the compensated signal into a signal advantageous for a long-distance signal, the testing system of the present inventive concepts may use a conventional facility structure as is. In addition, by moving a standard corresponding module for the communication interface from the testing apparatus to the active interface board, the testing system of the present inventive concepts enables generation and/or replacement of facility at low cost and with a short development period only by replacing the active interface board.

The testing system and an operating method thereof according to some example embodiments of the present inventive concepts compensate for a signal in the closest vicinity to a wafer (or a device under test (DUT)) in order to test a high-speed signal, and by converting the signal into a signal advantageous for long-distance at the same frequency as the received signal, a high-speed signal test may be performed (e.g., based on processing the converted signal).

Figure 3:
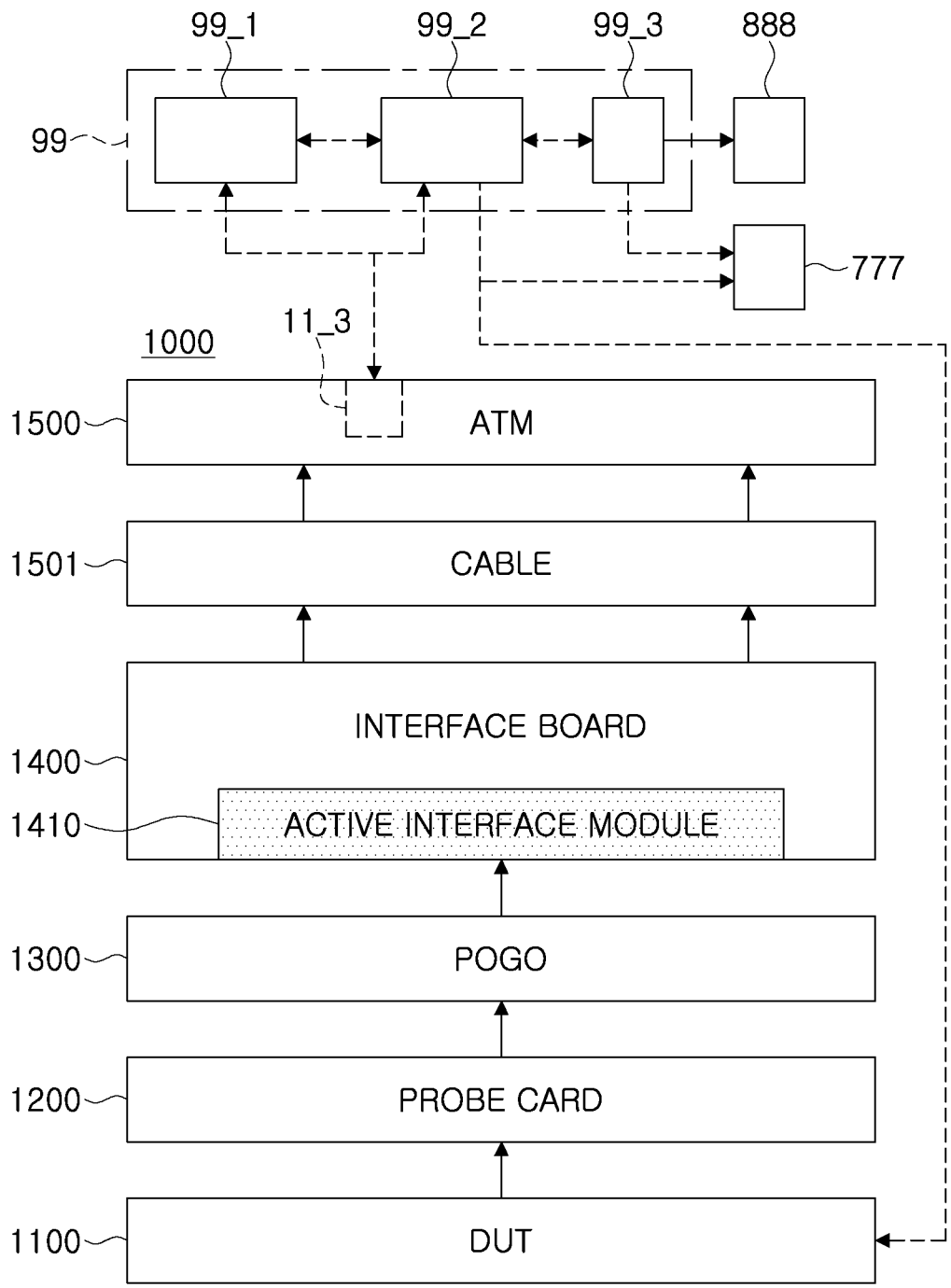
FIG. 3 is a diagram illustrating a testing system according to some example embodiments of the present inventive concepts.

FIG. 3 is a diagram illustrating a testing system 1000 according to some example embodiments of the present inventive concepts. Referring to FIG. 3, the testing system 1000 may include a probe card 1200, a pogo block POGO 1300, an interface board 1400, and a testing apparatus ATM 1500. In some example embodiments, the testing system 100 may include some or all of the elements of the testing system 1 shown in FIG. 1, including light source 50, computer COM 60, the elements of testing apparatus 40 and interface board 30 in the testing apparatus 1500 and interface board 1400, respectively, any combination thereof, or the like.

The probe card 1200 may be configured to contact one or more pads of a device under test (DUT) 1100. The probe card 1200 may be provided to perform a test process for testing electrical characteristics of a device under test (DUT) 1100. For example, the probe card 1200 may apply electrical signals to image sensors formed on the DUT 1100 on a wafer, and may be provided to perform an electric die sorting (EDS) process for determining whether the DUT 1100 (e.g., image sensors) are defective by signals output from the image sensors in response to the applied electrical signals. In addition, the probe card 1200 may be applied to an arbitrary test process for testing whether the DUT 1100 (e.g., plurality of image sensors) are defective.

For example, the probe card 1200 may apply at least one of an electrical signal provided from a testing apparatus 1500, for example, at least one of power and a signal to a wafer including a plurality of image sensors (e.g., DUT 1100), and may provide a signal output in response to the applied electrical signal to the testing apparatus 1500 (e.g., as an output signal of the probe card 1200). During the test process, a probe pin may physically contact a pad on the wafer (e.g., the DUT 1100) to transmit an electrical signal to the wafer, or receive a signal output from the wafer.

At least a portion of the probe pin may be an input probe pin for transmitting an electrical signal provided from the testing apparatus 1500 to the wafer. Also, at least a portion of the probe pin may be an output probe pin for receiving an electrical signal output from the wafer. Such a probe pin may be referred to as a probe needle or a probe.

In some example embodiments, the probe card 1200 may be a cantilever probe card, a vertical probe card, and a membrane probe card, or the probe card 1200 may be a micro-electric-mechanical systems (MEMS) probe card.

The pogo block POGO 1300 may include a plurality of pins for connecting the probe card 1200 and the interface board 1400. Here, each of the plurality of pins may include a POGO pin. The pogo block POGO 1300 may be configured to receive output signals of the probe card 1200.

The interface board 1400 may be implemented to map the probe card 1200 and the testing apparatus 1500. Also, the interface board 1400 may include an active interface module 1410. The active interface module 1410 may be implemented corresponding to a communication standard of the DUT 1100. In some example embodiments, the active interface module 1410 may be implemented to be inserted into the interface board 1400 through a module connector in a modular manner. For example, the active interface module 1410 may be implemented in one of Mobile Industry Processor Interface (MIPI) C-PHY, MIPI D-PHY, MIPI M-PHY, and MIPI A-PHY. MIPI is a serial interface connecting hardware and software between the processor and peripheral devices according to a serial interface communication standard. Accordingly, it will be understood that the interface board 1400 may be configured to correspond to (e.g., conform to) one or more serial interface communication standards of the image sensor (e.g., DUT 1100). Meanwhile, it should be understood that the active interface module 1410 of the present inventive concepts is not limited to the above-described MIPI standards. The active interface module 1410 of the present inventive concepts may perform communication according to any type of communication interface corresponding to a serial interface standard output from a CMOS image sensor.

The testing apparatus (ATM) 1500 may be implemented to transmit input and control signals to at least one image sensor (e.g., DUT 1100) through the probe card (1200). The testing apparatus 1500 may be implemented to simultaneously test the DUT 1100 (e.g., based on signals received through a cable 1501 connecting the testing apparatus 1500 and the interface board 1400). Here, the DUT 1100 may include a wafer having a plurality of image sensors. In some example embodiments, the testing apparatus 1500 may be connected to the interface board 1400 through a cable 1501.

In the testing system 1000 according to some example embodiments of the present inventive concepts, in order to receive a high-speed signal, the active interface module 1410 for receiving a high-speed signal may be positioned adjacent to the wafer (e.g., DUT 1100). In general, high-speed signals require less length and less contact structures to reduce loss. As the signal speed increases, a signal loss may occur between the pogo block 1300 and the interface board 1400.

In some example embodiments, the active interface module 1410 may add a signal compensation circuit to compensate for a loss between the wafer (e.g., DUT 1100) [and] the probe card 1200 and between the pogo block 1300 and the interface board 1400. In some example embodiments, the active interface module 1410 may include a long-distance signal generation circuit being changed to a differential signal level advantageous for a long distance without changing the speed of the frequency. For example, the interface board 1400 may be configured to receive output signals of the pogo block 1300 (which may be and/or may correspond to output signals of the probe card 1200), convert the received output signals of the pogo block 1300, and output the converted signals through the cable 1501, where the interface board 1400 may include active interface module 1410 configured to amplify the received output signals of the pogo block 1300, convert the amplified signals into the converted signals such that the converted signals have a same frequency as the received output signals of the pogo block 1300, and transmit the converted signals to the cable 1501. In some example embodiments, the active interface module 1410 may include a standard corresponding circuit capable of responding even if an interface output from the wafer (e.g., DUT 1100) is changed. The active interface module 1410 can modularize the above-described signal compensation circuit, long-range signal generation circuit, and standard corresponding circuit. Therefore, even if the signal interface standard of the product of the image sensor is changed, only the active interface module 1410 is developed, so that the testing system 1000 of the present inventive concepts can be tested to the new interface standard more quickly.

In some example embodiments, the testing apparatus 1500 is configured to process the converted signals received via the cable 1501 to determine whether the DUT 1100 passes or fails the testing. For example, the testing apparatus 1500 may compare the converted signals to a reference signal and determine a logic state of the converted signal (e.g., a state of '11' if the converted and reference signals match, a state of '00' if the converted and reference signals do not match, etc.) based on the comparison, where the DUT 1100 is determined to pass or fail the test based on the logic state (e.g., pass if logic state '11', fail if logic state '00', where the logic states may be considered to be a test result). In some example embodiments, the testing system 1000 may include the computer 60 shown in FIG. 1, and the testing apparatus 1500 may transmit converted signals to the computer 60 for processing as described with reference to FIG. 1 to determine whether the DUT 1100 passes or fails the testing (e.g., based on performing image processing of the converted signals).

A testing system 1000, and further a testing apparatus 1500 may thus be configured to perform the high-speed signal test of the DUT 1100. As a result of providing such a testing system 1000 and testing apparatus 1500 configured to perform a high-speed signal test of a DUT 1100, costs associated with developing the test device, including fabrication cost of the test device, costs associated replacing main components related to signal generation in an existing testing system, or the like may be reduced, thereby improving the practicality and cost-effectiveness of both the testing system 1000 and/or testing apparatus 1500 and the manufacture of the device under test (DUT) 1100 (based on reducing the costs associated with testing such devices during manufacture thereof). Additionally, costs associated with manufacturing image sensors and/or electronic devices 888 as described herein based on providing such a testing system, based for example on the reduced costs associated with the testing provided by the test device in association with the manufacturing of image sensors and/or electronic devices 888. Additionally, the high-speed signal testing of the DUTs 1100 as provided by the testing system 1000 may enable improved testing of DUTs, thereby improving the reliability of devices selectively incorporated into electronic devices 888 based on the results of the testing and thus improving the reliability and performance of said electronic devices 888 based on using the testing system 1000 to test the DUTs.

Still referring to FIG. 3, in some example embodiments, the testing apparatus 1500 and/or testing system 1000 may be configured to determine a logic state and/or voltage level of a test result based performing a high-speed signal test of the DUT 1100 as described herein. Based on determining the logic state and/or voltage level of the test result, the testing apparatus 1500 and/or testing system 1000 may determine whether the DUT 1100 passes or fails a test. As shown in FIG. 3, the testing system 1000 (e.g., the testing apparatus 1500 and/or the interface board 1400) may include a communication interface 11_3, for example a wired or wireless communication interface or transceiver. The testing apparatus 1500 and/or the interface board 1400 may generate a pass/fail signal based on determining whether the DUT 1100 passes or fails the test (which may be determined based on determining the logic state of the test result). For example, the testing apparatus 1500 may compare the converted signals to a reference signal and determine a logic state of the converted signal (e.g., a state of '11' if the converted and reference signals match, a state of '00' if the converted and reference signals do not match, etc.) based on the comparison, where the DUT 1100 is determined to pass or fail the test based on the logic state (e.g., pass if logic state '11', fail if logic state '00', where the logic states may be considered to be a test result). For example, based on determining that the logic state of a test result is '11', the DUT 1100 may be determined to have passed the test. In another example, based on determining that the logic state of a test result is '00', the DUT 1100 may be determined to have failed the test. The testing apparatus 1500 and/or the interface board 1400 may be configured to generate a pass/fail signal that indicates whether the DUT 1100 passed or failed the test and may transmit the pass/fail signal to an external device via the interface 11_3. In some example embodiments, the interface 11_3 may be included in a circuit of the testing apparatus 1500, for example a test control circuit of the testing apparatus 1500 according to some example embodiments.

Still referring to FIG. 3, the testing system 1000 may be communicatively coupled to a manufacturing system 99 that is configured to manufacture (e.g., mass produce) electronic devices 888 based on one or more input image sensors associated with the DUT 1100, such devices including the DUT 1100 and/or image sensors 777 that may be associated with the DUT 1100 (e.g., the DUT 1100 may be selected from a batch of image sensors and/or wafers that includes the image sensors 777 in order to serve as a representative of the image sensors 777 for testing by the testing system 1000). Electronic devices 888 may be image sensor devices such as the device under test DUT 1100 and/or image sensors 777 associated with the DUT 1100, and/or may be electronic devices that incorporate image sensors such as the device under test DUT 1100 and/or image sensors 777 associated with the DUT 1100 as components thereof. The manufacturing system 99 may include a control device 99_1, an actuator device 99_2, a manufacturing device 99_3 (which may be one or more manufacturing devices) that is configured to manufacture the electronic devices 888 based on using one or more image sensors as an input. The actuator device 99_2 may be a motorized manipulator, arm, deflector arm, gate, or the like which is configured to selectively manipulate, direct, and/or divert one or more image sensors to/from the manufacturing device 99_3, to an input area the manufacturing device 99_3 or discard area (e.g., diverted from the manufacturing process) to be excluded from being included in the manufactured electronic devices 888.

In some example embodiments, where the manufactured electronic devices 888 are the image sensors 777 and/or DUT 1100, the manufacturing device 99_3 and the actuator device 99_2 may be the same device, and the manufacturing of the electronic devices 888 may include selectively directing/forwarding certain image sensors (e.g., 777 and/or 1100) to a finished product area or diverting/discarding certain image sensors (e.g., 777 and/or 1100) to a separate (e.g., discard) area. In some example embodiments, where the manufactured electronic devices 888 incorporate the image sensors 777 and/or DUT 1100 as components thereof, the manufacturing device 99_3 and the actuator device 99_2 may be different devices, and the manufacturing device 99_3 may operate to assemble an electronic device 888 that incorporates one or more image sensors associated with the DUT 1100 (e.g., devices 1100 and/or 777) as one or more components thereof. In some example embodiments, the actuator device 99_2 may be a part of the manufacturing device 99_3, such that commands transmitted to control the actuator device 99_2 may be transmitted to the manufacturing device 99_3.

Still referring to FIG. 3, in some example embodiments, the aforementioned pass/fail signal generated at the testing system 1000, indicating whether the DUT 10 has passed or failed a test, may be received at the control device 99_1. The control device 99_1 may, in response to processing the pass/fail signal, selectively include or exclude one or more image sensors from being included in the image sensors that are input to the manufacturing device 99_3 to manufacture one or more electronic devices 888.

In some example embodiments, the control device 99_1 may command the actuator device 99_2 and/or the manufacturing device 99_3 to selectively include the DUT 1100 itself as an input to the manufacturing device 99_3 to be included in a manufactured electronic device 888 or to exclude (e.g., divert, discard, etc.) the DUT 10 from being input to the manufacturing device 99_3 and thus excluded from the manufactured electronic devices 888.

In some example embodiments, the DUT 1100 may be selected from image sensors 777 (which may be a particular batch of manufactured image sensors) and may be tested at testing system 1000 as a representative of the image sensors 777. Accordingly, it will be understood that the image sensors 777 may be associated with the DUT 1100 (e.g., based on the DUT 1100 being selected from a batch of image sensors that also includes the image sensors 777). The control device 99_1 may command the actuator device 99_2 and/or the manufacturing device 99_3 to selectively include or exclude the particular image sensors 777 (which may or may not further include DUT 1100) as an input to the manufacturing device 99_3 to be included in, or excluded from being included in, the manufactured electronic devices 888 in response to the DUT 1100 being determined to pass or fail the test, respectively.

Accordingly, the control device 99_1 may cause the manufacturing system 99 to manufacture one or more electronic devices 888 such that one or more particular image sensors associated with the DUT 1100 (which may include image sensors 777 and may or may not include the DUT 1100) are selectively included in or excluded from the one or more manufactured electronic devices 888, based on a determined logic state and/or voltage level of the test result received (e.g., at the testing apparatus 1500) from the DUT 1100.

FIGS. 4A, 4B, 4C, and 4D are diagrams illustrating MIPI standards according to some example embodiments of the present inventive concepts.

Figure 4A:
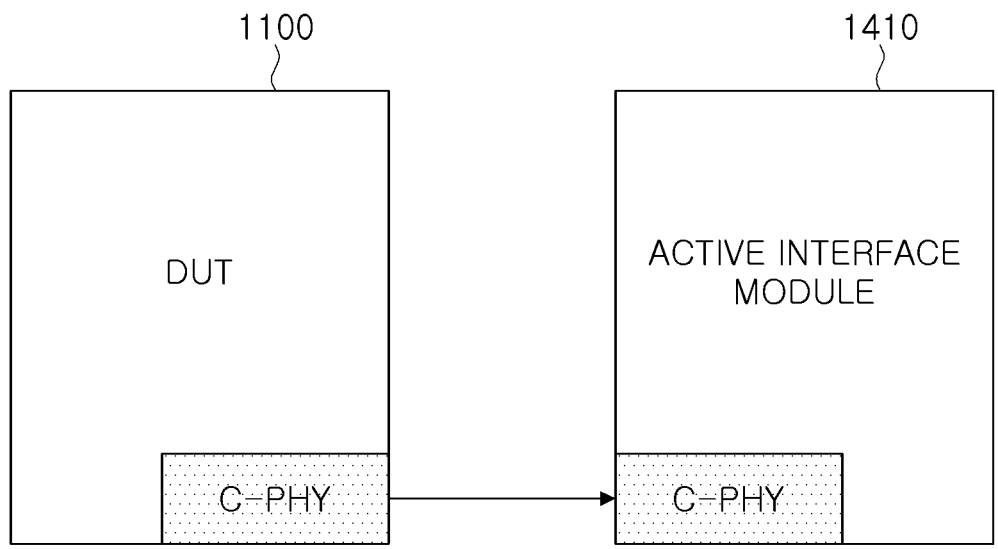
FIGS. 4A, 4B, 4C, and 4D are diagrams illustrating MIPI standards according to some example embodiments of the present inventive concepts.

Referring to FIG. 4A, the active interface module 1410 may receive test data from the DUT 1100 according to a MIPI C-PHY communication standard. C-PHY has only up to up to a maximum of 3 data lanes, and unlike D-PHY, 3 transmission lines are used per lane. A clock has no separate lane and is embedded in the data being transmitted. Therefore, a module (CDR, Clock Data Recovery) finding the embedded clock on a data receiving side is used. C-PHY, one lane consists of three lines, and each line transmits High, Middle, and Low signals. Accordingly, a total of 27 types of signals can be transmitted through one lane. Thereamong, only six cases that can utilize the characteristics of a differential signal are selected and used.

Figure 4B:
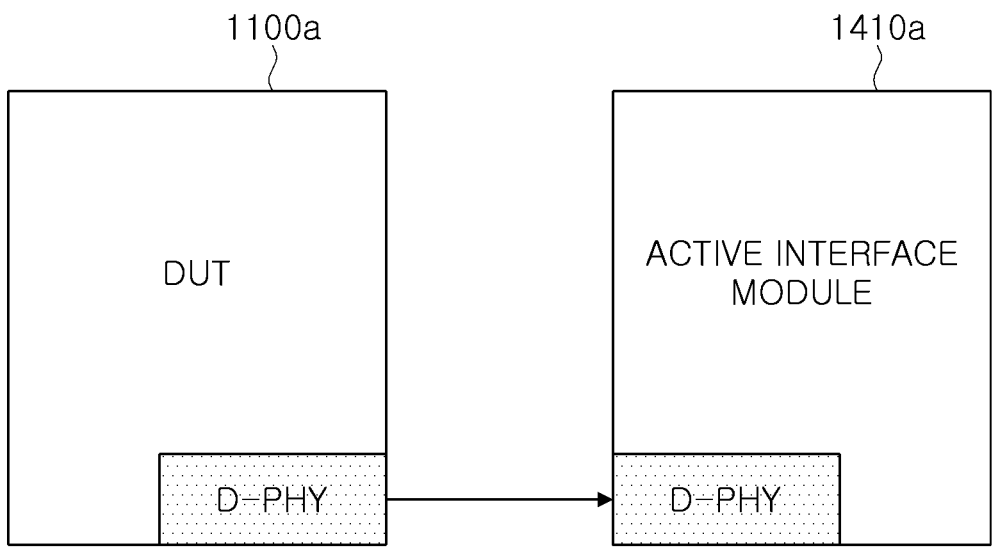

Referring to FIG. 4B, an active interface module 1410a may receive test data from a DUT 1100a according to the MIPI D-PHY communication standard. D-PHY performs a basic role that a general physical layer (PHY) plays. An operation of adding Start of packet (SoT)/End of packet (EoT) indicating a start and an end of actual data and converting parallel data to serial data for transmission or converting received serial data to parallel data is performed. In addition, a clock system to transmit a clock signal for high-speed image data transmission is managed. D-PHY can operate in either a high-speed module or a low-power module. The high-speed module is used to transmit high-speed image data, and is transmitted through two transmission lines as a differential signal of 80 Mb/s~1 Gb/s transmission rate with a common mode voltage of 0.2V and a swing of 0.2V in a Scalable Low Voltage Signaling (SLVS) method. In a high-speed mode, a clock signal is sent through a separate clock lane. The D-PHY consists of one clock lane and one or up to a maximum of four data lanes.

Figure 4C:
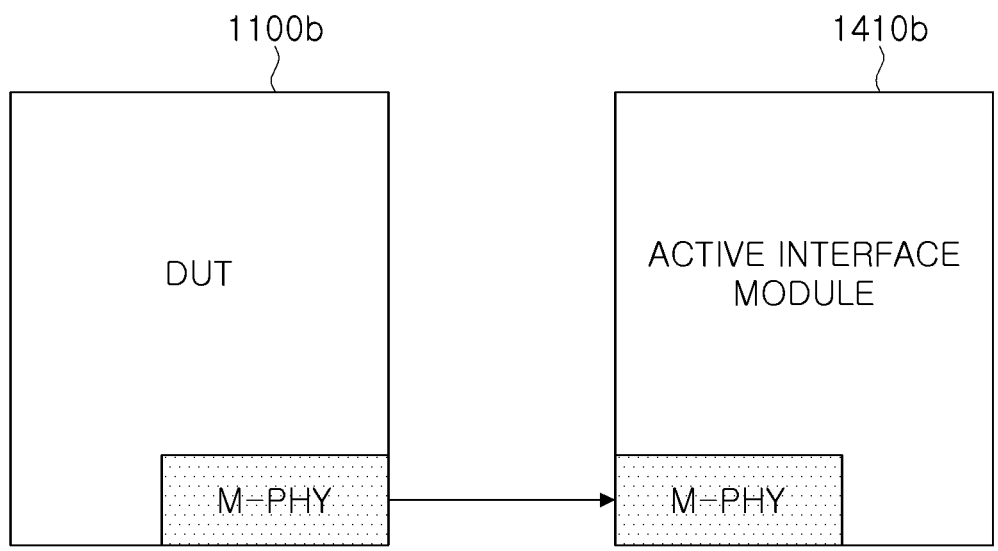

Referring to FIG. 4C, an active interface module 1410b may receive test data from a DUT 1100b according to a MIPI M-PHY communication standard. In M-PHY, a clock takes an embedded method in which data is included and transmitted. Therefore, a clock data recovery (CDR) to read the clock from data is required at a receiving end. In M-PHY, an 8b/10b encoding method is used. In a high-speed mode of M-PHY, it is possible to transmit up to a maximum of 5.8 Gb/s per lane. In a low-power mode, transmission may be performed at 10k to 600 Mb/s. In M-PHY, simultaneous bidirectional transmission/reception is possible (full duplex mode), transmission lanes are gathered to form a transmission sub-link, and reception lanes are gathered to form a reception sub-link. Each of the sub-links can have up to a total of 4 lanes.

Figure 4D:
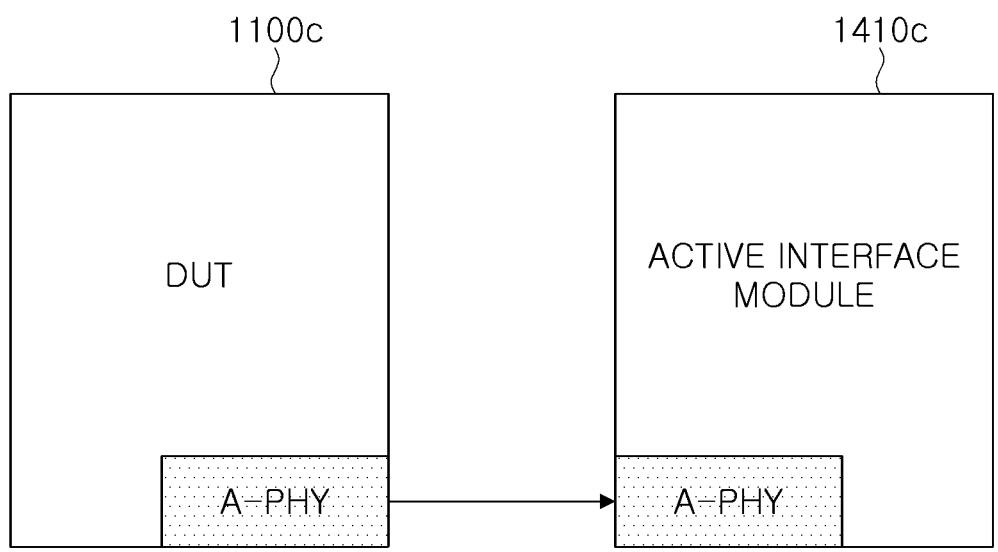

Referring to FIG. 4D, an active interface module 1410c may receive test data from a DUT 1100c according to a MIPI A-PHY communication standard. In order to use a MIPI technology in automobiles, components acting as a bridge in the middle are used. This is called a SerDes solution. Since MIPI DSI, or CSI signals cannot travel long distances, they are converted into serial signals that can travel long distances through a serializer component. After it is moved, it is restored to an original signal through a DeSerializer. An A-PHY specification is a SerDes solution that can transmit signals up to 15 meters. Meanwhile, signals transmitted through the MIPI A-PHY are DP/eDP, MIPI DSI, and MIPI CSI. These transmitted signals are converted into signals suitable for A-PHY through a Protocol Adaptation Layer (PAL).

Figure 5:
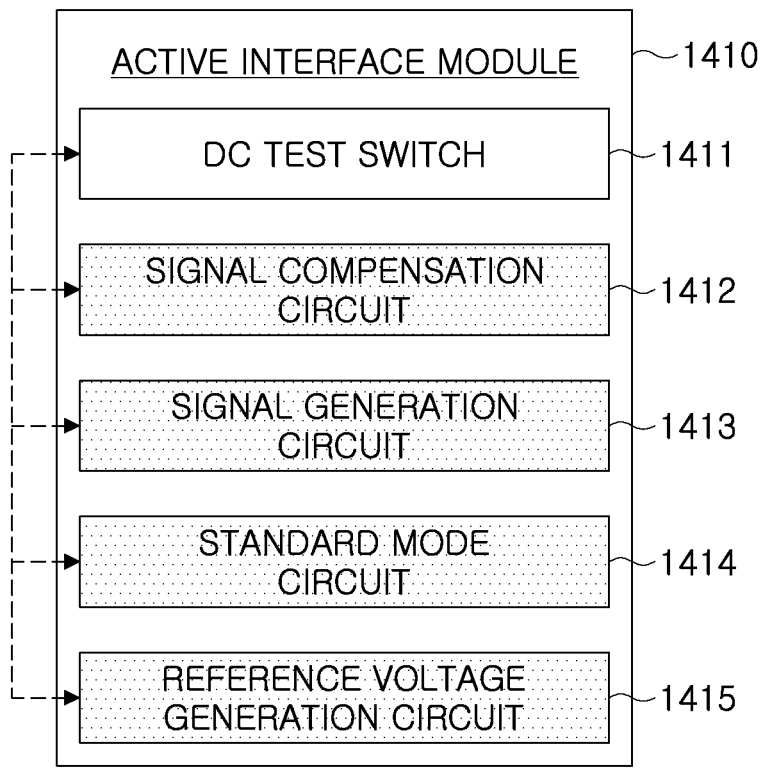
FIG. 5 is a diagram illustrating an active interface module 1410 according to some example embodiments of the present inventive concepts.

FIG. 5 is a diagram illustrating an active interface module 1410 according to some example embodiments of the present inventive concepts. Referring to FIG. 5, an active interface module 1410 may include a DC test switch 1411, a signal compensation circuit 1412, a signal generation circuit 1413, a standard mode circuit 1414, and a reference voltage generation circuit 1415.

The DC test switch 1411 (also referred to herein as a DC switch circuit) may be implemented to switch to a DC test circuit of the testing apparatus 1500 to perform an electrical test of a pin of the DUT 1100.

The signal compensation circuit 1412 may be implemented to compensate for losses between the DUT 1100 and the probe card 1200 and between the pogo block 1300 and the interface board 1400. In some example embodiments, the signal compensation circuit 1412 may include an operational amplifier (OP-AMP) for signal amplification.

The signal generation circuit 1413 may be implemented to change the received test signal to a differential signal level advantageous over a long distance without changing a speed of the frequency. In some example embodiments, the signal generation circuit 1413 may include a comparator that compares a signal level with a reference value.

The standard mode circuit 1414 may include a circuit corresponding to a serial interface standard of an image signal output from an image sensor. In some example embodiments, the standard mode circuit 1414 may be implemented to perform a normal test even if a standard interface output from the DUT 1100 is changed.

The reference voltage generation circuit 1415 may be implemented to receive a deviation offset value between components through a control of a reference voltage controller of the testing apparatus 1500 to compensate for the deviation between the components of the amplifier of the signal compensation circuit 1412, and to generate a reference value to which an offset value is applied. In some example embodiments, the reference voltage generation circuit 1415 may include a digital-to-analog converter (DAC) connected to a high-speed signal line.

In some example embodiments, the active interface module 1410 may include a DC switch circuit 1411 connected in series to a high-speed signal line, a signal compensation circuit 1412, a signal generation circuit 1413, or a reference voltage generation circuit 1415. In some example embodiments, the active interface module 1410 may include at least one circuit of a DC switch circuit 1411, a signal compensation circuit 1412, a signal generation circuit 1413, or a reference voltage generation circuit 1415, where the at least one circuit is connected in series to a high-speed signal line.

Figure 6:
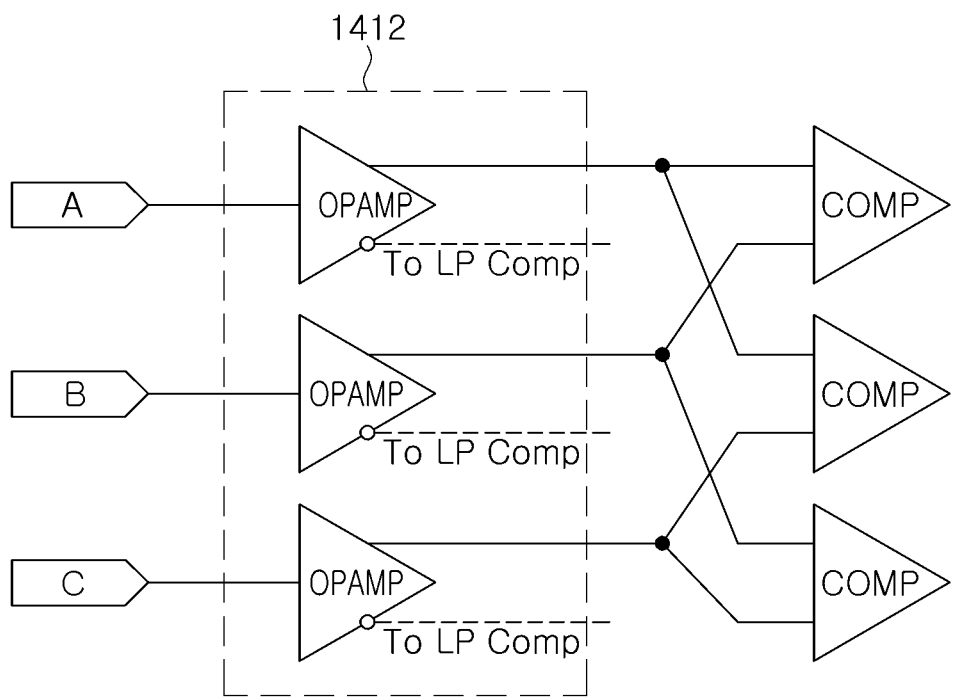
FIG. 6 is a diagram illustrating a signal compensation circuit 1412 according to some example embodiments of the present inventive concepts.

FIG. 6 is a diagram illustrating some example embodiments of a signal compensation circuit 1412 according to some example embodiments of the present inventive concepts. Referring to FIG. 6, the signal compensation circuit 1412 may be implemented to compensate for a loss due to a branch circuit in a test operation.

A MIPI signal is input to three lines A, B, and C, and each comparator compares a voltage difference between the two lines. Each of the three comparators must receive A and B, B and C, and C and A signals. Therefore, each signal is branched into two lines and input to two comparators. The signal compensation circuit 1412 according to some example embodiments of the present inventive concepts may be implemented as a differential output operational amplifier (OPAMP). That is, the signal compensation circuit 1412 may operate the differential output OPAMP as a signal branching and signal equalizer circuit. In general, OPAMP has a function of amplifying a signal (outputting a high voltage with a low output impedance). Therefore, a signal can be transmitted with a high voltage on both lines. In addition, in a signal transmitted from a long distance, a high-frequency component is attenuated more than a low-frequency component. If a capacitor is attached in parallel to an output resistance of the OPAMP to bypass the high-frequency component, the high-frequency component can operate as a signal restoration circuit (Equalizer) with a greater amplification factor than the low-frequency component. A signal loss can be reduced by connecting the other unused one of the differential OPAMP outputs of the present inventive concepts to a low voltage comparator (LP comparator).

Figure 7:
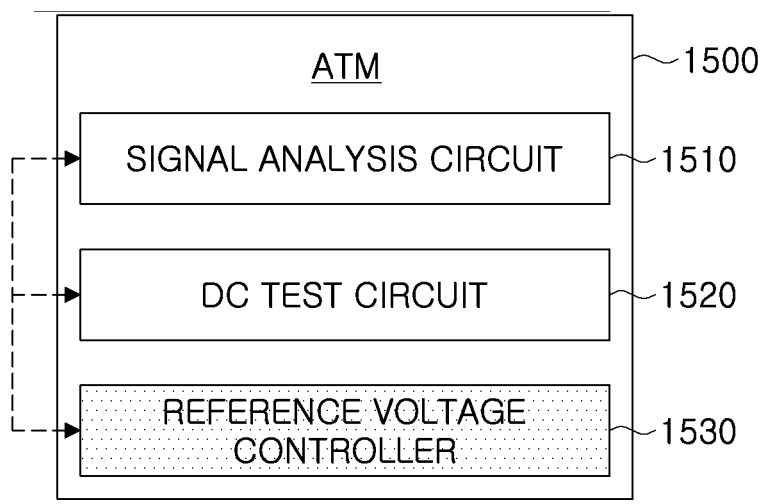
FIG. 7 is a diagram illustrating a testing apparatus 1500 according to some example embodiments of the present inventive concepts.

FIG. 7 is a diagram illustrating a testing apparatus 1500 according to some example embodiments of the present inventive concepts. Referring to FIG. 7, the testing apparatus 1500 may include a signal analysis circuit 1510, a DC test circuit 1520, and a reference voltage controller 1530.

The signal analysis circuit 1510 may be implemented to receive an image signal from the DUT 1100, which may be an output signal of a probe card 1200 contacting pads of the DUT 1100 and/or a pogo block 1300 configured to receive output signals of the probe card 1200, and analyze the received image signal. The signal analysis circuit 1510 may correct an error generated when a high-speed serial signal is distorted due to an influence of a transmission line or a time delay occurs.

The DC test circuit 1520 may be implemented to receive a voltage of an output pad of the DUT 1100, and perform a DC test by comparing the received voltage with a test voltage.

The reference voltage controller 1530 may be implemented to control the reference voltage generation circuit 1415 of the interface board 1400 in order to reduce variations between components.

Figure 8A:
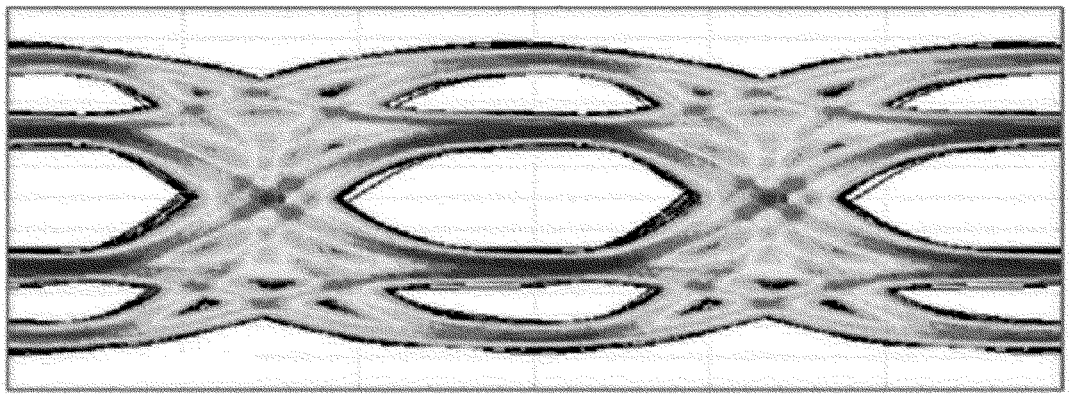
FIGS. 8A, 8B, 8C, and 8D are diagrams illustrating example signal waveforms in a process of transmitting a test signal according to some example embodiments of the present inventive concepts.
Figure 8B:
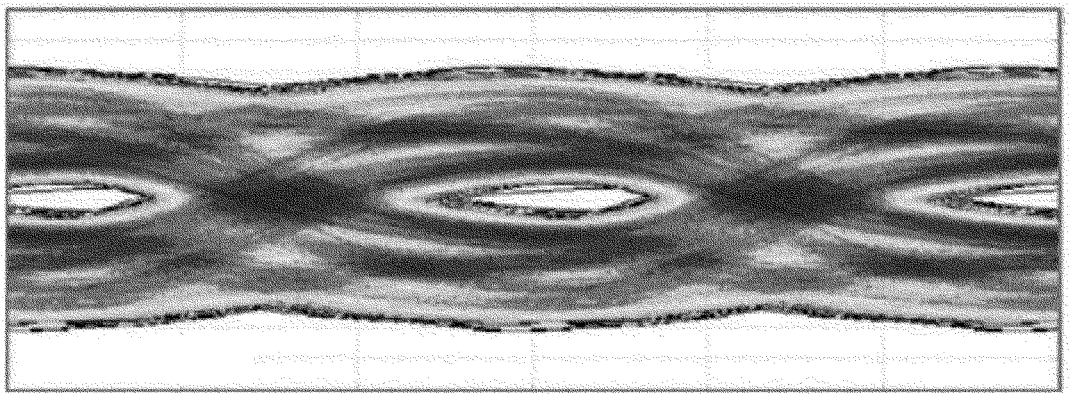
Figure 8C:
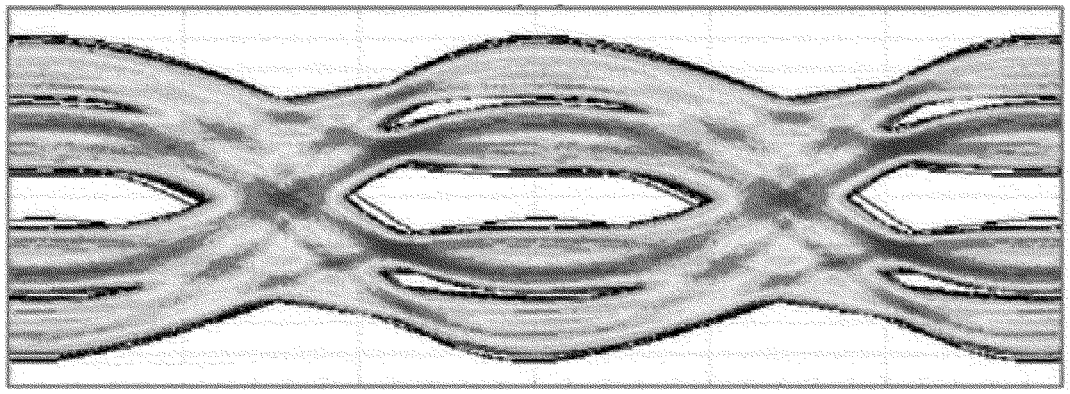
Figure 8D:
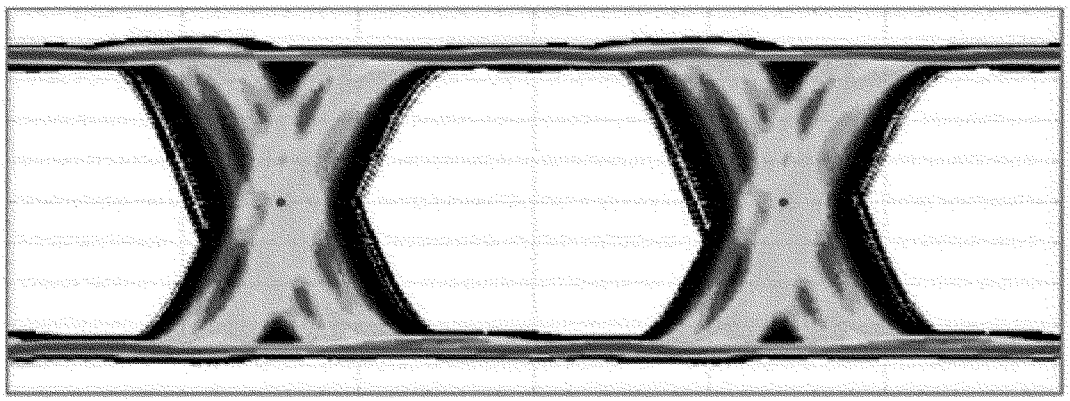

FIGS. 8A, 8B, 8C, and 8D are diagrams illustrating signal waveforms in a process of transmitting a test signal according to some example embodiments of the present inventive concepts. FIG. 8A illustrates an eye diagram for an output signal of the DUT 1100, and FIG. 8B illustrates an eye diagram for a signal between the pogo block 1300 and the interface board 1400. Here, this signal is input to the signal compensation circuit 1412. FIG. 8C illustrates an eye diagram for an output signal of the signal compensation circuit 1412 of the interface board 1400. FIG. 8D illustrates an eye diagram for an output signal of the long distance signal generation circuit 1413 of the interface board 1400.

Figure 9:
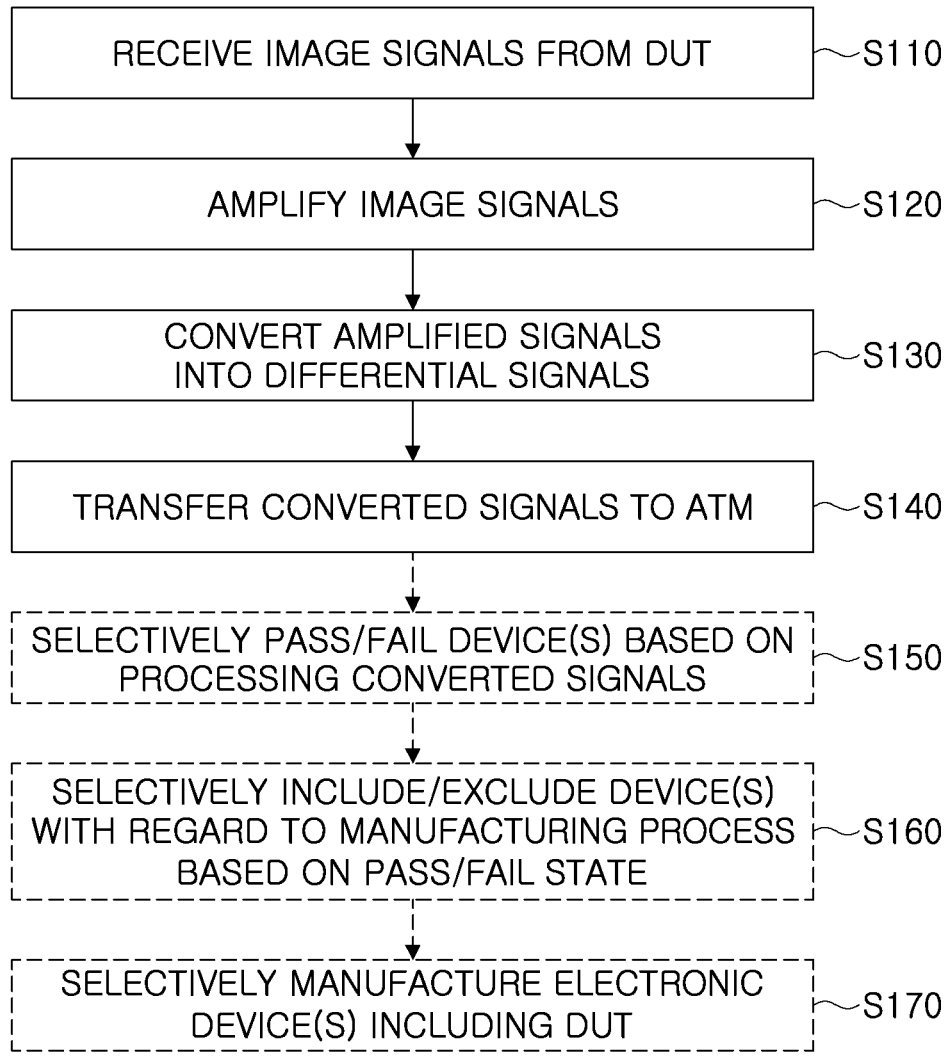
FIG. 9 is a flowchart illustrating an operating method of an interface board 1400 according to some example embodiments of the present inventive concepts.

FIG. 9 is a flowchart illustrating an operating method of an interface board 1400 according to some example embodiments of the present inventive concepts. The operating methods shown in FIG. 9 may be performed by any of the example embodiments of the testing system and/or manufacturing system, including any embodiments of the testing apparatus and/or the testing system and/or manufacturing system control device. In some example embodiments, operations shown in FIG. 9 may be omitted from the operating methods of the testing system and/or may be performed in different orders than shown in FIG. 9. In some example embodiments the at least some of the operations of the methods shown in FIG. 9 may be performed in sequence and/or at least partially in parallel.

Referring to FIG. 9, an operation of the interface board 1400 may proceed as follows.

Image signals according to a first interface may be received from the DUT 1100, where the image signals may be output signals of a probe card 1200 contacting pads of the DUT 1100 and/or a pogo block 1300 configured to receive output signals of the probe card 1200 (refer to FIG. 3) (S110). The received image signals may be amplified (S120). The amplified signals may be converted into differential signals (S130), which may have a same frequency as the image signals received at S110. The converted signals may be transmitted to a testing apparatus (ATM), e.g., via a cable 1501 (S140). At least operations S120 to S140 may be implemented by the active interface module 1410 of the interface board.

In some example embodiments, the device under test (DUT) may include a plurality of image sensors disposed on a wafer. Here, different reference voltages may be generated according to positions of the plurality of image sensors. That is, deviation with respect to the reference voltage according to a position of a product in the wafer may be compensated. In some example embodiments, a reference voltage control signal may be received from the testing apparatus, and a reference voltage may be generated in response to the reference voltage control signal. In some example embodiments, the received signals may be switched to a testing apparatus for DC testing. In some example embodiments, each frequency of the received signals and each frequency of the converted signals may be the same.

In a testing system 1000 according to some example embodiments of the present inventive concepts, a signal compensation portion (an operational amplifier (op-amp)), a long-distance signal conversion portion (a comparator), and a reference voltage generation portion (a digital analog convertor (DAC)) in addition to the DC switch mounted on the interface board 1400 may be connected in series to a high-speed signal line.

A typical testing system cannot test a high-speed signal due to the length and structure of the transmission path. On the other hand, in the testing system according to some example embodiments of the present inventive concepts, a facility capable of high-speed signal testing includes an active interface module, thereby enabling high-speed signal testing. In addition, the testing system according to some example embodiments of the present inventive concepts enables the development of an active interface module at a low cost and in a relatively short period of time, and can extend a generation of existing equipment.

A selective determination may be made whether the DUT from which the image signals are received at S110 passes a test based on processing the converted signals that are transmitted to the testing apparatus (ATM) (S150). Such selective determination at S150 may include generating a pass/fail signal indicating whether the DUT passes the test based on the determined logic state. For example, in response to determination that the logic state of the processed converted signal corresponds to '00', the DUT may be determined at S150 to have failed the test and a pass/fail signal indicating that the DUT has failed the test may be generated. In another example, in response to determination that the logic state of the processed converted signal corresponds to '11', the DUT may be determined at S150 to have passed the test and a pass/fail signal indicating that the DUT has passed the test may be generated.

One or more image sensors may be selectively included in, or excluded from, one or more inputs of a manufacturing process to manufacture one or more electronic devices (S160). For example, the pass/fail signal generated at S150 may be transmitted to a control device (e.g., control device 99_1) which may process the pass/fail signal to determine whether the DUT has failed the test.

In response to determining that the DUT has passed the test, the control device may generate one or more control signals to cause one or more devices (e.g., actuator device 99_2 and/or manufacturing device 99_3) to selectively include (e.g., divert, direct, etc.) one or more certain image sensors associated with the DUT (e.g., image sensors 777 and/or the DUT itself) to be part of an input to the manufacturing system 99 (e.g., input to manufacturing device 99_3) so that the certain image sensors are, or are included in, the one or more manufactured electronic devices 888 that are manufactured by the manufacturing device 99_3. Said one or more image sensors selectively caused to be included as the input may include the DUT from which the image signals are received at S110 and/or may be separate image sensors (e.g., a batch of image sensors from which the DUT is selected for testing).

In response to determining that the DUT has failed the test, the control device may generate one or more control signals to cause one or more devices (e.g., actuator device 99_2 and/or manufacturing device 99_3) to selectively exclude (e.g., divert, discard, etc.) one or more certain image sensors associated with the DUT (e.g., image sensors 777 and/or the DUT itself) from being part of an input to the manufacturing system 99 (e.g., input to manufacturing device 99_3) so that the certain image sensors are excluded from being, or being included in, the one or more manufactured electronic devices 888. Said excluded devices may be selectively diverted (e.g., by the actuator device 99_2 and/or manufacturing device 99_3) to a discard area to be discarded, salvaged, repaired, or the like. Said one or more image sensors selectively caused to be excluded may include the DUT from which the PAM signal is received at S21 and/or may be separate image sensors (e.g., a batch of image sensors from which the DUT is selected for testing).

One or more electronic devices (e.g., electronic devices 888) may be manufactured based on selectively included input image sensors (S170), which may include or exclude the image sensors 777 and/or DUT pursuant to the outcome of S160. As a result, the testing of the DUT may selectively affect which image sensors are included in the manufactured electronic devices 888). Restated, one or more methods according to some example embodiments may include manufacturing one or more electronic devices (e.g., electronic devices 888) such that one or more particular image sensors associated with the DUT (e.g., image sensors 777 and/or the DUT itself) are selectively included in or excluded from the one or more manufactured electronic devices, based on the determined logic state of the test result.

Figure 10:
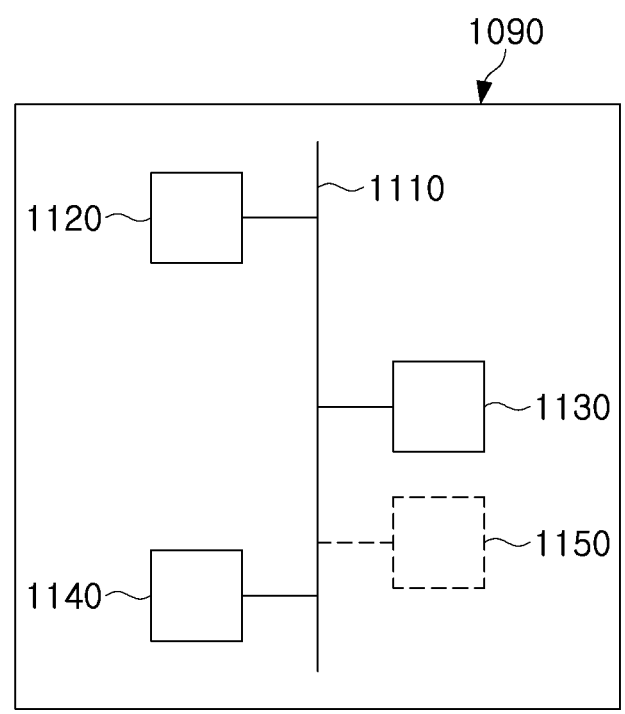
FIG. 10 is a block diagram of an electronic device according to some example embodiments.

FIG. 10 is a block diagram of an electronic device according to some example embodiments. Said electronic device may include and/or implement any of the electronic devices, systems, boards, modules, units, controllers, and/or circuits included in any of the example embodiments, including the one or more manufactured electronic devices 888 shown in FIG. 1, the control device 99_1 shown in FIG. 1, the manufacturing device 99_3 shown in FIG. 1, the actuator device 99_2 shown in FIG. 1, the testing system 1 shown in FIG. 1, the testing apparatus 40 shown in FIG. 1 (including power supply device (DPS) 41, device under test controller 42, image capture board (ICB) 43, and interface 11_3 thereof), the interface board 30 shown in FIG. 1, the DUT 10 shown in FIG. 1, The testing system 1000 shown in FIG. 3, the ATM 1500 shown in FIG. 3, the interface board 1400 and/or active interface module 1410 shown in FIG. 3, the DC test switch 1411 and/or any of the circuits 1411 to 1415 shown in FIG. 5, the ATM 1500 shown in FIG. 7, the circuits 1510 and 1520 shown in FIG. 7, the reference voltage controller 1530 shown in FIG. 7, any combination thereof, or the like.

Referring to FIG. 10, an electronic device 1090 may include a processor 1120, a memory 1130, and an interface 1140 that are electrically coupled together via a bus 1110. The electronic device 1090 may include one or more additional devices 1150 that may be coupled to the bus 1110. The interface 1140 may be a communication interface (e.g., a wired or wireless communication transceiver).

The one or more additional devices 1150 may include an image sensor 777, a device under test 10, an actuator of the actuator device 99_2, and/or a manufacturing device 99_3 that is configured to selectively include or exclude one or more image sensors as inputs to the manufacturing of one or more electronic devices 888. The one or more additional devices 1150 may include manufacturing devices configured to manufacture one or more electronic devices 888.

The memory 1130, which may be a non-transitory computer readable medium, may store a program of instructions and/or other information. The memory 1130 may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM). The processor 1120 may execute the stored program of instructions to perform one or more functions. For example, where the electronic device 1090 is included in and/or implements the control device 99_1, the processor 1120 may be configured to process pass/fail signals received from the testing system 1 to selectively include or exclude one or more image sensors as inputs the manufacturing device 99_3. The processor 1120 may be configured to generate an output (e.g., a command to control actuator device 99_2 and/or manufacturing device 99_3) based on such processing. In another example, the processor 1120 may execute programs of instruction stored at the memory 1130 to implement the functionality of any portion of the testing system 1, including any portion of the testing apparatus 40.

The processor 1120 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processor 1120 may be configured to generate an output (e.g., an image to be displayed on a display interface, a test result signal, etc.) based on such processing.

One or more of the processor 1120, memory 1130, interface 1140, and/or additional device(s) 1150 may be included in, include, and/or implement one or more instances of processing circuitry such as hardware including logic circuits, a hardware/software combination such as a processor executing software; or a combination thereof. In some example embodiments, said one or more instances of processing circuitry may include, but are not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, any of the memories, image sensors, memory units, or the like as described herein may include a non-transitory computer readable storage device, for example a solid state drive (SSD), storing a program of instructions, and the one or more instances of processing circuitry may be configured to execute the program of instructions to implement the functionality of some or all of any of the processor 1120, memory 1130, interface 1140, additional device(s) 1150, or the like according to any of the example embodiments as described herein.

In some example embodiments, some or all of the systems, units, modules, devices, circuits, controllers, and/or elements thereof as described herein with reference to any of the drawings (including without limitation any portion of the testing systems, testing apparatuses, interface boards, devices under test, image sensors, electronic devices, or the like according to any of the example embodiments) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), an application processor (AP), a microcomputer, a field programmable gate array (FPGA), and programmable logic unit, a microprocessor, application-specific integrated circuit (ASIC), a neural network processing unit (NPU), an Electronic Control Unit (ECU), and the like. In some example embodiments, the processing circuitry may include a non-transitory computer readable storage device, for example a solid state drive (SSD), storing a program of instructions, and a processor (e.g., CPU) configured to execute the program of instructions to implement the functionality of any of the elements of the systems, devices, and/or elements thereof as described herein, including without limitation the functionality of any portion of the testing systems, testing apparatuses, interface boards, devices under test, image sensors, electronic devices, or the like according to any of the example embodiments. It will be further understood that the processing circuitry may be configured to perform any of the methods as described herein, for example based on including include a non-transitory computer readable storage device, for example a solid state drive (SSD), storing a program of instructions, and a processor (e.g., CPU) configured to execute the program of instructions to implement any or all of the operations of any of the methods according to any of the example embodiments, including without limitation any or all of the operations of any or all of the methods shown in FIG. 9.

As set forth above, in an apparatus for testing an image sensor and an operating method thereof according to some example embodiments of the present inventive concepts, by an interface module corresponding to a standard of high-speed signal, an optimal test operation may be implemented according to various transmission methods.

Various and advantageous advantages and effects of the present inventive concepts are not limited to the above description, it will be more readily understood in the process of describing the specific example embodiments of the present inventive concepts.

While example embodiments have been shown and described above, it will be apparent to those skilled in the art that modifications and variations could be made without departing from the scope of the present inventive concepts, as defined by the appended claims.

What is claimed is:

1. A testing system for testing an image sensor, the testing system comprising:
    a light source configured to deliver an input light to a device under test;
    a probe card configured to contact pads of the device under test;
    a pogo block configured to receive output image signals of the probe card;
    an interface board configured to receive output image signals of the pogo block, to convert the received output image signals of the pogo block, and to output the converted signals through a cable; and a testing apparatus connected to the interface board through the cable, and configured to test the device undertest based on signals received through the cable, wherein the interface board includes an active interface module having a signal compensation circuit configured to amplify the received output signals of the pogo block, a signal generation circuit configured to convert the amplified signals into the converted signals such that the converted signals have a same frequency as the received output signals of the pogo block, transmit the converted signals to the cable, and generate a signal indicating a pass or a failure of a test based on a determination of whether the device under test passes or fails the test.

2. The testing system of claim 1, wherein the device under test comprises a plurality of image sensors on a wafer, the plurality of image sensors including the image sensor.

3. The testing system of claim 1, wherein the active interface module is configured to be inserted into the interface board through a module connector.

4. The testing system of claim 1, wherein the active interface module comprises a DC test switch configured to switch a signal received according to whether a DC test is performed to the testing apparatus.

5. The testing system of claim 1, wherein the active interface module further comprises a standard mode circuit having a circuit corresponding to a serial interface standard of a signal that is output from the image sensor.

6. The testing system of claim 1, wherein the active interface module, further comprises a reference voltage generation circuit configured to generate a reference voltage in response to a voltage control signal received from the testing apparatus.

7. The testing system of claim 6, wherein the reference voltage generation circuit comprises a digital-to-analog converter.

8. The testing system of claim 1, wherein the active interface module comprises at least one circuit of a DC switch circuit, a signal compensation circuit, a signal generation circuit, or a reference voltage generation circuit, wherein the at least one circuit is connected in series to a high-speed signal line.

9. An interface board for testing an image sensor, the interface board comprising:
  a DC switch circuit configured to switch received signals to a testing apparatus for DC testing, the received signals being image signals output from a device under test that receives an input light from a light source;
  a signal compensation circuit configured to amplify the received image signals;
  a signal generation circuit configured to convert the amplified signals into differential signals having a same frequency as the received image signals and to generate a signal indicating a pass or a failure of a test based on a determination of whether the device under test passes or fails the test;
  a standard mode circuit having a circuit corresponding to a communication standard of the image sensor; and
  a reference voltage generation circuit configured to generate a reference voltage in response to a voltage control signal received from the testing apparatus.

10. The interface board of claim 9, further comprising an active interface module modularizing at least one of the DC switch circuit, the signal compensation circuit, the signal generation circuit, the standard mode circuit, or the reference voltage generation circuit,
  wherein the active interface module is configured to be inserted into the interface board through a module connector.

11. The interface board of claim 9, wherein the signal compensation circuit is configured to be implemented as an operational amplifier.

12. The interface board of claim 9, wherein the signal generation circuit comprises a comparator configured to output the differential signals.

13. The interface board of claim 9, wherein the interface board corresponds to one or more serial interface communication standards of the image sensor.

14. An operating method of an interface board for testing an image sensor, the operating method comprising:
  receiving image signals output from a device under test that receives an input light from a light source;
  amplifying, by a signal compensation circuit, the received image signals;
  converting, by a signal generation circuit, the amplified signals into differential signals;
  transmitting, by the signal generation circuit, the converted signals to a testing apparatus via a cable; and
  generating, by the signal generation circuit, a signal indicating a pass or a failure of a test based on a determination of whether the device under test passes or fails the test.

15. The operating method of claim 14, wherein the device under test comprises a plurality of image sensors on a wafer, the plurality of image sensors including the image sensor,
  wherein the method includes generating different reference voltages according to positions of the plurality of image sensors.

16. The operating method of claim 15, wherein the generating the different reference voltages comprises, for each separate reference voltage of the different reference voltages:
  receiving a separate reference voltage control signal from the testing apparatus; and
  generating the separate reference voltage in response to the separate reference voltage control signal.

17. The operating method of claim 14, further comprising switching the received image signals to the testing apparatus for DC testing.

18. The operating method of claim 14, wherein a frequency of each of the received image signals is a same frequency as a frequency of each of the converted signals.

* * * * *